(12) United States Patent
Imanishi

(10) Patent No.: US 7,099,259 B2
(45) Date of Patent: Aug. 29, 2006

(54) EXPOSURE APPARATUS, EXPOSURE METHOD, RECORDING AND/OR REPRODUCING APPARATUS, AND RECORDING AND/OR REPRODUCING METHOD

(75) Inventor: Shingo Imanishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 393 days.

(21) Appl. No.: 10/373,490

(22) Filed: Feb. 24, 2003

(65) Prior Publication Data

US 2003/0184832 A1   Oct. 2, 2003

(30) Foreign Application Priority Data

Feb. 28, 2002   (JP)   ............................. 2002-054837

(51) Int. Cl.
*G11B 7/00*   (2006.01)

(52) U.S. Cl. ............................... 369/112.24; 369/44.23

(58) Field of Classification Search ............ 369/44.11, 369/113.34, 13.34, 13.33
See application file for complete search history.

(56) References Cited

U.S. PATENT DOCUMENTS

| | | | | |
|---|---|---|---|---|
| 6,115,347 A * | 9/2000 | Ichimura et al. ....... | 369/112.24 |
| 6,667,809 B1 * | 12/2003 | Hill ............................. | 356/511 |
| 6,717,896 B1 * | 4/2004 | Imanishi ................... | 369/53.27 |
| 6,721,259 B1 * | 4/2004 | Yamamoto et al. ..... | 369/112.26 |
| 6,738,323 B1 * | 5/2004 | Imanishi et al. ......... | 369/44.32 |
| 6,754,161 B1 * | 6/2004 | Masuhara et al. ..... | 369/112.01 |
| 2004/0013077 A1 * | 1/2004 | Saito et al. ............ | 369/112.24 |

* cited by examiner

*Primary Examiner*—Thang V. Tran
*Assistant Examiner*—Lixi Chow
(74) *Attorney, Agent, or Firm*—Robert J. Depke; Rockey, Depke, Lyons & Kitzinger LLC

(57) ABSTRACT

An exposure apparatus has an exposure laser light source, a detection laser light source, a converging lens assembly, detector and a controller. The exposure laser light source emits an exposure laser beam. The detection laser light source emits a detection laser beam. The converging lens assembly receives the exposure laser beam and the detection laser beam, and is disposed in a near-field region of the exposure surface of a negative. The detector detects a linearly polarized component of a detection laser beam reflected off the distal end surface of the converging lens assembly. The controller controls the distance between the distal end surface of the converging lens assembly and the exposure surface on the basis of a detection signal from the detector.

49 Claims, 3 Drawing Sheets

EXPOSURE APPARATUS, EXPOSURE METHOD, RECORDING AND/OR REPRODUCING APPARATUS, AND RECORDING AND/OR REPRODUCING METHOD

BACKGROUND OF THE INVENTION

This application claims priority to Japanese Patent Application Number JP2002-054837 filed Feb. 28, 2002, which is incorporated herein by reference.

1. Field of the Invention

The present invention relates to an exposure apparatus and an exposure method for exposing a negative by making use of near-field light, and a recording and/or reproducing apparatus and a recording and/or reproducing method primarily for recording information signals in an optical recording medium by making use of near-field light.

2. Description of the Related Art

Recently, in response to the demand for a higher density of an optical disk, a solid immersion lens (SIL), which is shaped like a spherical lens partly cut off and exhibits a high refractive index, is disposed between an object lens and a negative or an optical disk thereby to achieve a further smaller spot diameter. Thus, a larger numerical aperture (e.g., larger than 1) NA than the numerical aperture NA of the object lens itself is achieved. The SIL is disposed such that its spherical surface faces the object lens, while the opposite surface, namely, its cut surface, faces the negative or the like. The larger numerical aperture can be achieved also by using a solid immersion mirror (SIM).

To perform exposure of a negative or to record or reproduce information signal by using the SIL, the laser beams that have passed through an object lens are condensed at the SIL and the distance between a distal end surface, i.e., the lowermost edge surface, of the SIL (the surface of the STL that opposes the negative or the like) and the surface of the negative or the like to be irradiated is shortened to be close to a near-field region where near-field light is generated. Furthermore, gap control has to be carried out to maintain a constant distance or gap length between the distal end surface of the SIL and the surface of the negative or the like to be irradiated.

Carrying out the gap control requires the detection of the gap length. One of the available methods for such detection is a total reflection detection method. The total reflection detection method utilizes the fact that, if the distal end surface of the SIL is considerably spaced away from the surface of the negative to be irradiated, then the high NA components ($NA \geq 1.0$) of the light incident upon a converging lens assembly formed of the SIL and an object lens are totally reflected by the distal end surface of the SIL, while the optical power of return light reduces as the distal end surface of the SIL approaches a near-field region with respect to the surface of the negative to be irradiated.

In other words, servo control is conducted to control the position of the converging lens assembly so as to maintain the gap length at which the reduced optical power of the light returning from the distal end surface of the SIL reaches a predetermined value. This is the gap control whereby the distance between the distal end surface of the SIL and the surface of the negative to be irradiated is maintained at a constant value.

However, when the light reflection used for negative exposure or for recording or reproducing information signals in order to carry out the gap control based on the total reflection detection method, the quantity of light incident upon the SIL, which should provide a reference, varies according to exposure or recording conditions or the like. This means that the gap length varies accordingly unless, for example, the servo retracting target value is readjusted each time exposure power or the like is changed.

Furthermore, if the irradiation power required for negative exposure or recording or reproducing information signals is small, then the signals may be overpowered by noises even when the total reflection detection described above is performed, providing no adequate servo detection signals.

In addition, if an exposure beam is modulated on the basis of a recording signal, then the modulated signal will be undesirably superimposed on a detection signal used for the servo control. Especially if a servo zone and a modulated signal zone are significantly away from each other, it is difficult to completely remove modulated signal components by using a frequency filter, although it is possible to reduce the modulated signal components. This results in noises.

As a solution to the problem described above, there has been proposed to use light dedicated to gap control that is not involved in negative exposure or the recording or reproduction of information signals. The dedicated light is separate from the light for exposure or the like, and has a constant quantity of light of adequate optical power.

However, using the gap control light independently from the exposure light or the like inevitably causes chromatic aberration of a converging lens assembly formed of an object lens and the SIL because of the difference in wavelength between the gap control light and the exposure light or the like. Hence, it is necessary to correct the chromatic aberration. As the wavelength difference between the gap control light and the exposure light increases, it becomes more difficult to correct the chromatic aberration. It is desired, therefore, to carry out the gap control under a condition where the chromatic aberration is minimized.

SUMMARY OF THE INVENTION

It is an object of the present invention to provide an exposure apparatus which resolves the above-mentioned problems.

It is another object of the present invention to provide a control method for a converging lens assembly which resolves the above-mentioned problems.

It is a further object of the present invention to provide a controller for a converging lens assembly which resolves the above-mentioned problems.

It is yet another object of the present invention to provide a recording and/or reproducing apparatus which resolves the above-mentioned problems.

According to one aspect of the present invention, there is provided an exposure apparatus, including an exposure laser light source for emitting an exposure laser beam, a detection laser light source for emitting a detection laser beam that is emitted from the exposure laser light source and has a wavelength different from that of the exposure laser beam, a converging lens assembly upon which the exposure laser beam and the detection laser beam are incident and which is disposed in a near-field region on an exposure surface of a negative, a detector for detecting a linear polarizing component of the detection laser beam reflected by the distal end surface of the converging lens assembly, and a controller for controlling the distance between the distal end surface of the converging lens assembly and the exposure surface on the basis of a detection signal from the detector.

According to another aspect of the present invention, there is provided a control method for a converging lens assembly, including the steps of causing a second laser beam having a different wavelength from the wavelength of a first laser beam to enter a converging lens assembly disposed in a near-field region on a surface to be irradiated, detecting a linear polarizing component of one of the laser beams reflected off the distal end surface of the converging lens assembly, and controlling the distance between the distal end surface of the converging lens assembly and the surface to be irradiated on the basis of a detection signal obtained as a detection result by moving the converging lens assembly in the direction of an optical axis.

According to still another aspect of the present invention, there is provided a converging lens assembly control apparatus, including a first laser light source for emitting a first laser beam, a second laser light source for emitting a second laser beam which is emitted from the first laser light source and has a different wavelength from that of the first laser beam, a converging lens assembly upon which the first laser beam and the second laser beam are incident and which is disposed in a near-field region on a surface to be irradiated, a detector for detecting a linear polarizing component of the detection laser beam reflected off the distal end surface of the converging lens assembly, and a controller for controlling the distance between the distal end surface of the converging lens assembly and the surface to be irradiated on the basis of a detection signal from the detector.

According to a further object of the present invention, there is provided a recording and/or reproducing apparatus including a recording and/or reproducing laser light source for emitting a recording and/or reproducing laser beam, a detection laser light source for emitting a detection laser beam having a different wavelength from that of the recording and/or reproducing laser beam, a converging lens assembly upon which the recording and/or reproducing laser beam and the detection laser beam are incident and which is disposed in a near-field region on a recording surface of a recording medium, a detector for detecting a linear polarizing component of the detection laser beam reflected off the distal end surface of the converging lens assembly, and a controller for controlling the distance between the distal end surface of the converging lens assembly and the recording surface on the basis of a detection signal from the detector.

DESCRIPTION OF THE PREFERRED EMBODIMENTS

The following will explain embodiments in accordance with the present invention in detail with reference to the accompanying drawings.

[First Embodiment]

Figure 1:
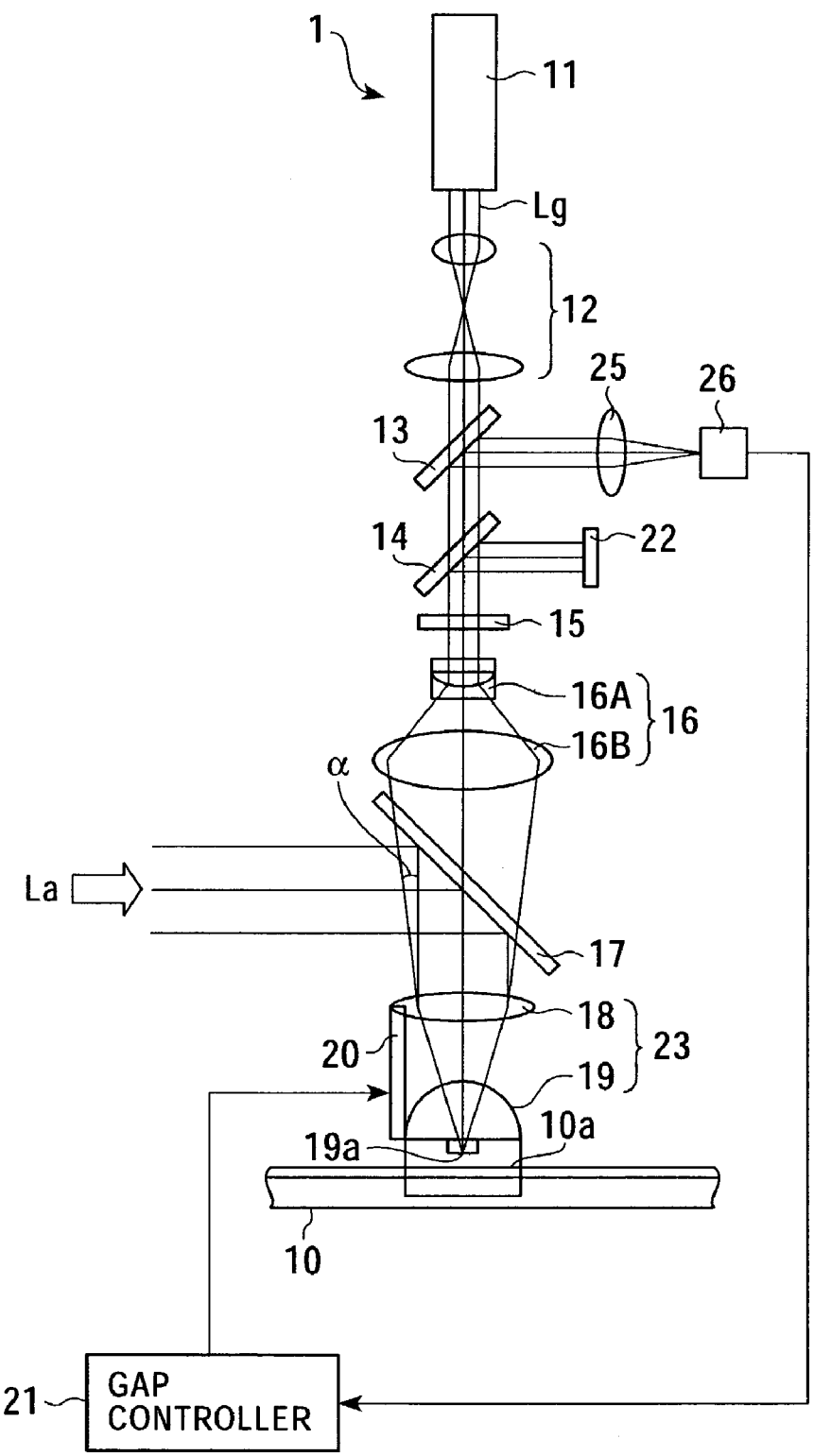
FIG. 1 is an explanatory diagram showing a schematic construction of an optical system for detecting a gap in an exposure apparatus according to a first embodiment of the present invention.

FIG. 1 shows a schematic construction of an optical system for gap detection in an exposure apparatus according to a first embodiment of the present invention. The exposure apparatus carries out gap control for maintaining a constant distance, i.e., a gap length, between a distal end surface, which is the lowermost end surface, of a SIL and the exposure surface of a negative 10 by an optical system for gap detection in order to expose the negative 10 by an exposure laser beam La. The exposure laser beam La is emitted from a laser light source, such as a gas laser (not shown).

An optical system for gap detection 1 has a light source for gap detection 11, a group of expander lenses 12, a normal beam splitter (NBS) 13, a polarizing beam splitter (PBS) 14, a quarter wave plate (QWP) 15, a group of convergence angle adjusting lenses 16, a dichroic mirror 17, a converging lens assembly 23 constructed of an object lens 18 and a SIL 19, an actuator 20, a gap controller 21, a beam stop 22, a condensing lens 25, and a photodetector (PD) 26.

The light source for gap detection 11 is a laser light source for emitting a gap detection laser beam Lg, and provided separately from the light source for exposure. The wavelength of the gap detection laser beam Lg emitted from the gap detection light source 11 is preferably set to be as close to the wavelength of an exposure laser beam La from the exposure laser light source as possible as long as it does not damage the negative 10.

Minimizing the difference between the wavelength of the gap detection laser beam Lg and the wavelength of the exposure laser beam La makes it possible to reduce the chromatic aberration of the converging lens assembly 23. Moreover, the diameters of the dichroic mirror 17 and the convergence angle lens constituting the group of convergence angle adjusting lenses 16 can be reduced by setting the wavelength of the gap detection laser beam Lg to be close to that of the exposure laser beam La so as to reduce the chromatic aberration of the converging lens assembly 23. This allows the optical system for gap detection to be made smaller.

However, if the wavelength of the gap detection laser beam Lg is set to be excessively close to the wavelength of the exposure laser beam La, then a resist 10a of the negative 10 would be undesirably exposed by the gap detection laser beam Lg. If the wavelength of the gap detection laser beam Lg is excessively shortened to bring it closer to the wavelength of the exposure laser beam La, then the optical energy of the gap detection laser beam Lg becomes too high, possibly damaging the negative 10.

If the wavelength of the gap detection laser beam Lg cannot be bring closer to the wavelength of the exposure laser beam La, the chromatic aberration can alternatively be corrected by making adjustment using the group of convergence angle adjusting lenses 16.

As the light source for gap detection 11, a second harmonic generation (SHG) laser having a wavelength of, for example, 532 nm is used if the resist 10a is a novolak-based G-line (436 nm). The SHG laser having the 532 nm wavelength allows the chromatic aberration of the converging lens assembly 23 to be reduced, because the wavelength is close to, for example, 351 nm or 413 nm, which is the wavelength of the exposure laser beam La. Moreover, the SHG laser of this wavelength will not expose a resist of, for example, a novolak-based G-line (436 nm) resist on the negative 10, so that the resist 10a will hardly be damaged.

To expose the resist 10a formed of a chemically amplified resist by the exposure laser beam La having a wavelength of, for example, 266 nm, using a laser of a shorter wavelength of, for example, 351 nm as the light source for gap detection 11 makes it possible to reduce the chromatic aberration due to its wavelength being close to that of the exposure laser beam La. In addition, the chemically amplified resist on the negative 10 will not be exposed, and damage attributable to increased optical energy from the short wavelength of the light source 11 will hardly happen.

The power of the light source for gap detection 11 is set so as not to damage the negative 10. If the power of the light source for gap detection 11 is too high, then the negative 10 will be damaged. For instance, the power of the light source for gap detection 11 is set to 1 mW or more but below 20 mW when an SHG laser having a wavelength of 532 nm is used as the light source for gap detection 11, the negative 10 is rotated at a relative speed of 1.5 m/s with respect to the converging lens assembly 23, and the novolak-based G-line (436 nm) resist is exposed with a 0.5-μm spot diameter. In this case, if the power of the light source for gap detection 11 is set to 20 mW or more, then the negative 10 will be damaged, while an inadequate gap detection signal will result if it is set to be below 1 mW.

The group of expander lenses 12 is constructed primarily of, for example, a condensing lens and a collimator lens. The beam stop 22 is formed of, for example, a black plate, that absorbs light. Alternatively, an arrangement may be made to cause light to be scatter at a sufficiently remote point, without providing the beam stop 22.

The group of convergence angle adjusting lenses 16 adjusts a convergence angle α of a gap detection laser beam incident upon the converging lens assembly 23. The group of convergence angle adjusting lenses 16 is constructed of, for example, a concave lens 16A and a convex lens 16B. In this construction, the distance between the concave lens 16A and the convex lens 16B is adjusted thereby to adjust the convergence angle α of a gap detection laser beam. For instance, if the convex lens 16B is fixed, and the concave lens 16A is moved away from the convex lens 16B, then the convergence angle α increases, meaning that the gap detection laser beam converges. If the concave lens 16A is moved toward the convex lens 16B, then the convergence angle α decreases, meaning that the gap detection laser beam diverges. The group of convergence angle adjusting lenses 16 does not have to be formed of the concave lens 16A and the convex lens 16B; it may have any other construction as long as a laser beam is diverged once, then converged to be incident upon the converging lens assembly 23. For instance, two convex lenses may be used to constitute the group of convergence angle adjusting lenses 16.

The dichroic mirror 17 is a wavelength-selective mirror, which is adapted to reflect only laser beams of a particular wavelength. In this embodiment, the dichroic mirror 17 is constructed to reflect only the exposure laser beam La. The dichroic mirror 17 is preferably as thin as possible.

A second group of lenses is constituted by the converging lens assembly 23 formed of the object lens 18 and the SIL 19. The SIL 19 is a spherical lens with a part thereof cut off that has a high refractive index. The SIL 19 is disposed such that its spherical surface faces the object lens 18, while a distal end surface 19a, which is the lowermost end surface at the opposite side from the spherical surface, faces the exposure surface of the negative 10.

The numerical aperture (NA) of the converging lens assembly 23 constructed of the object lens 18 and the SIL 19 is set to 1 or more if the material filling in the gap is air.

The object lens 18 and the SIL 19 are integrally supported by a supporting member (not shown). An actuator 20 formed of, for example, a piezo element is attached to the support member. The actuator 20 is not limited to the piezo element; it may be, for example, an electromagnetic actuator or the like.

Using the gap detection optical system 1, the descriptions will now be given of the principle based on which gap control is carried out to obtain a constant distance between a distal end surface 19a of the SIL 19 and the exposure surface of the negative 10.

The gap detection laser beam Lg having a wavelength that is different from but as close as possible to the wavelength of the exposure laser beam La is emitted from the light source for gap detection 11. The gap detection laser beam Lg passes through the group of expander lenses 12 that increases the diameter of the gap detection laser beam Lg, and enters the NBS 13. A part of the gap detection laser beam Lg incident upon the NBS 13 passes through the NBS 13 and enters the PBS 14.

The gap detection laser beam Lg incident upon the PBS 14 passes through the PBS 14 substantially by 100% because it is P-polarized with respect to the reflective surface of the PBS 14. The gap detection laser beam Lg that has passed through the PBS 14 passes through the quarter wave plate 15 to be converted into a circularly polarized beam. The quarter wave plate 15 is disposed such that the crystal axis thereof is inclined 45 degrees with respect to the direction of incident polarization.

The convergence angle α of the gap detection laser beam Lg that has passed through the quarter wave plate 15 is adjusted as the laser beam Lg passes through the group of convergence angle adjusting lenses 16 and the dichroic mirror 17 before it enters the object lens 18. To be more specific, the convergence angle α is adjusted by the group of convergence angle adjusting lenses 16 so that a high NA component of the gap detection laser beam Lg in the region wherein the NA of the converging lens assembly 23 is 1 or more is condensed at the distal end surface 19a of the SIL 19. The adjustment method will be discussed hereinafter.

The gap detection laser beam Lg with the convergence angle α adjusted by the group of convergence angle adjusting lenses 16 passes through the dichroic mirror 17 and enters the object lens 18. The gap detection laser beam Lg incident upon the object lens 18 is converged and reaches the SIL 19.

Of the gap detection laser beam Lg incident upon the SIL 19, the light incident upon the distal end surface 19a at an angle of a critical angle or less is reflected off the distal end surface 19a and turned into a return beam that passes through the SIL 19, the object lens 18, the dichroic mirror 17 and the group of convergence angle adjusting lenses 16, then converted into a linearly polarized light by the quarter wave plate 15. The return light converted into the linearly polarized light by the quarter wave plate 15 is incident upon the PBS 14 in the form of s polarized light, so that it is reflected by the PBS 14. The return light reflected by the PBS 14 is absorbed by the beam stop 22. Thus, the beam stop 22 that absorbs the return light reflected by the PBS 14 makes it possible to prevent the reflective component of the return light from going back toward the PBS 14.

Meanwhile, of the gap detection laser beam Lg reaching the SIL 19, the light incident upon the distal end surface 19a at an angle of the critical angle or more, namely, the high NA component of the gap detection laser beam Lg in the region where the NA of the converging lens assembly 23 constructed of the object lens 18 and the SIL 19 is 1 or more, is reflected by the distal end surface 19a and turns into an elliptically polarized light. The elliptically polarized light is not converted into the linearly polarized light even after passing through, as return light, the SIL 19, the object lens 18, the dichroic mirror 17, the group of convergence angle adjusting lenses 16 and the quarter wave plate 15. Hence, the s polarized component of the return light is reflected by the PBS 14 and absorbed by the beam stop 22, while the p polarized component of the return light passes through the PBS 14.

The p polarized component of the return light that has passed through the PBS 14 is partly transmitted through the NBS 13, while partly reflected. The return light, which is the partly reflected off the NBS 13, is condensed by the condensing lens 25, and the p polarized component of the return light is detected by the PD 26. In other words, the optical energy of the p polarized component of the return light in the same polarized state as the p polarization, i.e., the polarized state of the gap detection laser beam Lg is detected by the PD 26.

If the distal end surface 19a of the SIL 19 and the exposure surface of the negative 10 are sufficiently apart from each other and the distal end surface 19a of the SIL 19 is away from the near-field region, then the optical power of the return light detected by the PD 26 indicates a predetermined value. This is because, of the gap detection laser beam Lg, the light incident upon the distal end surface 19a of the SIL 19 at a critical angle or more is totally reflected off the distal end surface 19a. If, however, the distance between the distal end surface 19a of the SIL 19 and the exposure surface of the negative 10 approaches the near-field region of, for example, the wavelength of light, then the components of the gap detection laser beam Lg totally reflected off the distal end surface 19a of the SIL 19 begins to permeate toward the negative 10. This leads to reduced optical power of the return light detected by the PD 26. Furthermore, if the gap between the distal end surface 19a of the SIL 19 and the exposure surface of the negative 10 reaches zero, then almost all components of the gap detection laser beam Lg that have been totally reflected by the distal end surface 19a of the SIL 19 are transmitted to the negative 10, resulting in virtually zero detected optical power of the return light detected by the PD 26.

A reference level is set at, for example, about 60% with respect to the detected optical power of the p polarized component of the return light when there is a sufficient distance between the distal end surface 19a of the SIL 19 and the exposure surface of the negative 10 and a sufficient distance from the near-field region. The gap controller 21 controls the object lens 18 and the SIL 19 as one piece in the direction of the optical axis of the converging lens assembly 23 by the actuator 20 formed of, for example, a piezo element such that the detected optical power of the return light detected by the PD 26 becomes the reference level. This allows a constant gap to be, maintained between the distal end surface 19a of the SIL 19 and the exposure surface of the negative 10.

More specifically, in the gap controller 21, a gap control voltage is output in response to a detection signal based on the detected optical power of the p polarized component of the return light detected by the PD 26, the detection signal indicating the amount to be controlled. The gap control voltage controllably expands or contracts the actuator 20, which is formed of, for example, a piezo element, thereby to control the distance between the converging lens assembly 23 constructed of the object lens 18 and the SIL 19 to which the piezo element is attached, and the exposure surface of the negative 10.

An example of the method for adjusting the convergence angle α will be explained. The adjustment is performed using the group of convergence angle adjusting lenses 16 to condense the high NA component of the gap detection laser beam Lg in the region, wherein the NA of the converging lens assembly 23 is 1 or more, at the distal end surface 19a of the SIL 19. In other words, the convergence angle α is adjusted to bring the focal position of the gap detection laser beam Lg close to the distal end surface 19a of the SIL 19.

First, before exposing the negative 10, a dummy negative, for example, of the negative 10 is used to provide sufficient space between the distal end surface 19a of the SIL 19 and the irradiated surface of the dummy negative so as to place the distal end surface 19a of the SIL 19 away from the near-field region. Of the gap detection laser beam Lg, the light incident upon the distal end surface 19a of the SIL 19 at the critical angle or more, i.e., the high NA component of the gap detection laser beam Lg in the region, wherein the NA of the converging lens assembly 23 is 1 or more, is totally reflected by the distal end surface 19a of the SIL 19.

The p polarized component of the return light of the gap detection laser beam Lg totally reflected off the distal end surface 19a of the SIL 19 is transmitted through the PBS 14. Therefore, the convergence angle α of the gap detection laser beam Lg is adjusted by the group of convergence angle adjusting lenses 16 so as to maximize the quantity of the return light, which has passed through the PBS 14, by minimizing the chance of being subjected to kick or loss from reflection or absorption in a lens optical path. Thus, adjusting the convergence angle α of the gap detection laser beam Lg so as to maximize the quantity of the p polarized component of the return light which has passed through the PBS 14 and which is in the same polarized state as that of the p polarized light (the gap detection laser beam Lg) is substantially identical to adjusting the convergence angle α of the gap detection laser beam Lg so as to condense the high NA component of the gap detection laser beam Lg in the region, wherein the NA of the converging lens assembly 23 is 1 or more, at the distal end surface 19a of the SIL 19.

To check that the quantity of the p polarized component of the return light, which is in the same polarized state as the p polarized light of the gap detection laser beam Lg, is maximized, the characteristic can be utilized in which the return light that has passed through the PBS 14 goes back in the same optical path as that of the gap detection laser beam Lg incident upon the PBS 14. For instance, a part of the gap detection laser beam Lg incident upon the PBS 14 and a part of the return light that has passed through the PBS 14 are extracted using a beam splitter, and the beam diameters thereof are detected. If the detected beam diameters are equal, then it means that the quantity of the return light that has passed through the PBS 14 is maximized. In other words, the convergence angle α of the gap detection laser beam Lg is adjusted by the group of convergence angle adjusting lenses 16 such that the detected beam diameter of gap detection laser beam Lg entering the PBS 14 and the beam diameter of the return light that has passed through the PBS 14 are equal.

Alternatively, the maximized quantity of the return light that has passed through the PBS 14 may be checked by detecting the quantity of the return light that has passed through the PBS 14 by the PD 26 so as to see that the detection signal indicates the maximized quantity.

In the adjustment of the convergence angle by the group of convergence angle adjusting lenses 16, the quantity of the return light transmitted through the PBS 14 does not have to be always the maximum quantity as long as a sufficient quantity of light required for the gap control is obtained.

Thus, the gap control is carried out using the gap detection laser beam Lg having the wavelength that is different from but as close as possible to the wavelength of the exposure laser beam La, and the exposure laser beam La is reflected by the dichroic mirror 17 to be incident upon the converging lens assembly 23. This allows the exposure laser beam La condensed onto the distal end surface 19a of the SIL 19 to permeate so as to expose the negative 10 by making use of the near-field light.

In the present embodiment, the gap detection laser beam Lg having a different wavelength from that of the exposure laser beam La is separately provided for the gap control. This arrangement protects the gap control from being adversely affected when the power or the like of the exposure laser beam La is changed according to individual exposure conditions or the like. In this embodiment, the irradiation power of the gap detection laser beam Lg can be adjusted to obtain a sufficient quantity of return light required for the gap control even if the irradiation power of the exposure laser beam La is small. Furthermore, according to the embodiment, even if the exposure laser beam La is modulated in response to a recording signal, the gap detection laser beam Lg will not be subjected to the influences of the modulation.

According to the embodiment, the convergence angle $\alpha$ of the gap detection laser beam Lg can be adjusted by the group of convergence angle adjusting lenses 16, so that the chromatic aberration of the converging lens assembly 23 attributable to the difference in wavelength from the exposure laser beam La can be corrected. Therefore, the gap control for maintaining the constant distance between the distal end surface 19a of the SIL 19 and the exposure surface of the negative 10 can be stably performed with high accuracy. The signal-to-noise ratio (SNR) of an optical disk made using the negative 10 will be improved. Further stable gap control with higher accuracy can be achieved, allowing the SNR of the optical disk to be further improved by adjusting the convergence angle $\alpha$ of the gap detection laser beam Lg by the group of convergence angle adjusting lenses 16 so as to maximize the quantity of the return light, which has been transmitted through the PBS 14.

Furthermore, in the present embodiment, the wavelength of the gap detection laser beam Lg is brought close to the wavelength of the exposure laser beam La, making it possible to reduce the chromatic aberration itself of the object lens 18 and the SIL 19. Hence, the diameter of the group of convergence angle adjusting lenses 16 or the like can be decreased, permitting a reduced size of an optical system incorporating the group of lenses.

In addition, the embodiment is adapted to properly select the wavelength and power of the gap detection laser beam Lg so as not to damage the negative 10, thus permitting good exposure.

[Second Embodiment]

Figure 2:
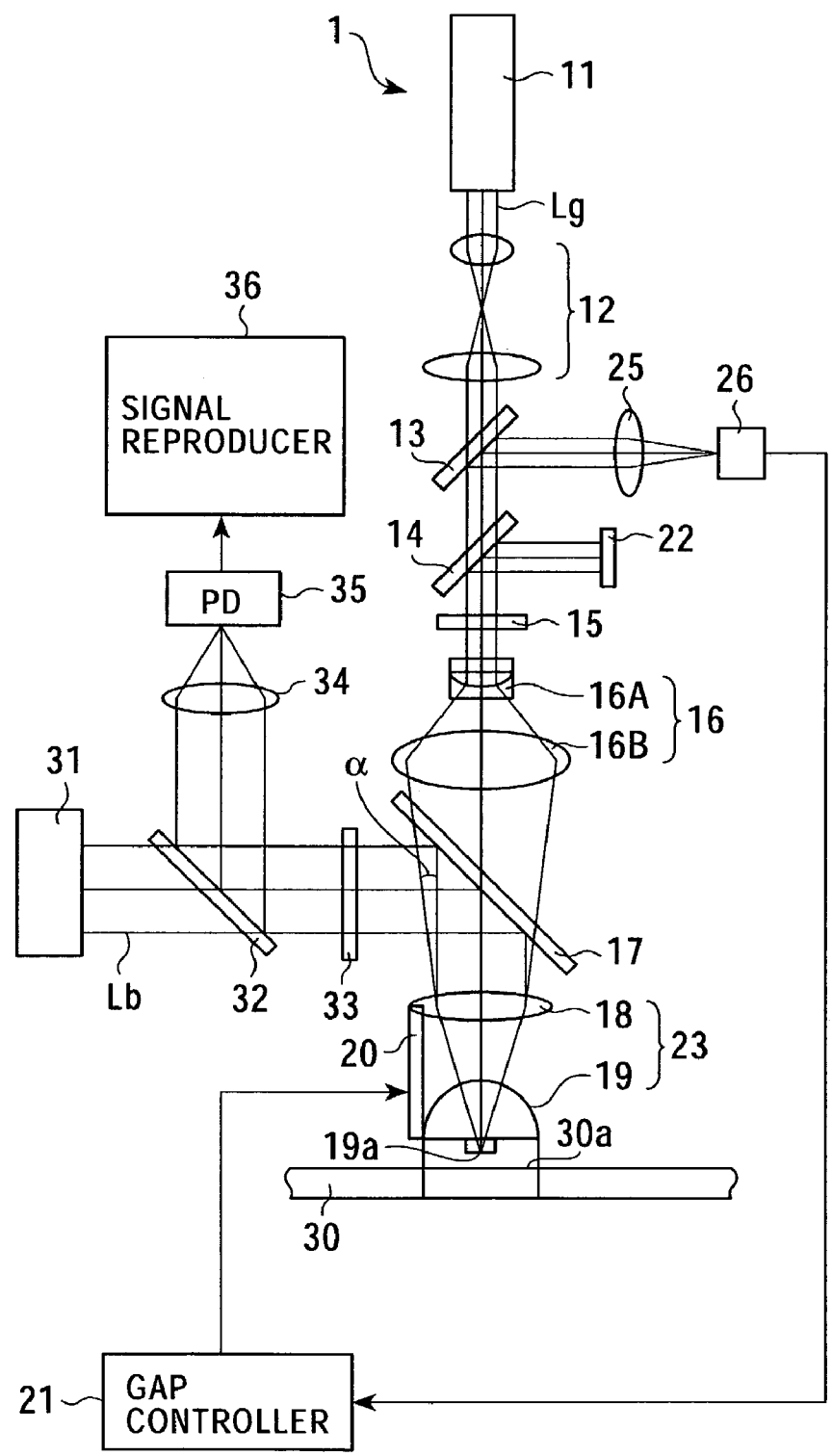
FIG. 2 is an explanatory diagram showing a schematic construction of an optical system for detecting a gap in an optical disk apparatus according to a second embodiment of the present invention.

FIG. 2 shows a schematic construction including a gap detection optical system for an optical disk apparatus according to a second embodiment of the present invention. The optical disk apparatus is adapted to carry out gap control for maintaining a constant distance between a distal end surface 19a, which is the lowermost end surface of a SIL 19, and a signal recording surface 30a of an optical recording medium 30 by the gap detection optical system to record and/or reproduce information signals in and/or from the signal recording surface 30a of the optical recording medium 30. The optical disk apparatus according to this embodiment has a gap detection optical system constructed in the same manner as that of the gap detection optical system in the first embodiment. In the optical disk apparatus according to the second embodiment, therefore, the same components as those in the exposure apparatus in the first embodiment will be assigned the same reference numerals, the descriptions in the first embodiment will be quoted, and only the aspects different from the first embodiment will be explained.

The optical disk apparatus includes a gap detection optical system 1 constructed in the same manner as that in the first embodiment, a recording and/or reproducing laser light source unit 31, and a PBS 32, a quarter wave plate 33, a condensing lens 34, a PD 35 and a signal reproducer 36 that make up the system for reproducing return light modulated on the basis of information signals of the optical recording medium 30. The recording and/or reproducing laser light source unit 31 includes a group of expander lenses or the like. For the recording and/or reproducing laser light source, a GaN type semiconductor laser having an emission wavelength of, for example, about 405 nm is used.

A gap detection light source 11 is provided independently of the recording and/or reproducing laser light source unit 31. The wavelength of a gap detection laser beam Lg emitted from the gap detection light source 11 is set to be as close to the wavelength of a recording and/or reproducing laser beam Lb as possible, as long as it does not damage the optical recording medium 30.

Setting the wavelength of the gap detection laser beam Lg to be close to the wavelength of the recording and/or reproducing laser beam Lb makes it possible to reduce the chromatic aberration of a converging lens assembly 23. By bringing the wavelength of the gap detection laser beam Lg close to the wavelength of the recording and/or reproducing laser beam Lb so as to reduce the chromatic aberration of the object lens 18 or the like, the diameters of a dichroic mirror 17 and a group of convergence angle adjusting lenses 16 can be decreased. This arrangement allows the gap detection optical system to be made smaller.

However, if the wavelength of the gap detection laser beam Lg is set to be excessively close to the wavelength of the recording and/or reproducing laser beam Lb, then the recording or reproduction of information signal in or from the optical recording medium 30 will be adversely affected. If the wavelength of the gap detection laser beam Lg is set to be excessively short in order to bring it close to the wavelength of the recording and/or reproducing laser beam Lb, then the optical energy may be unduly increase, possibly damaging the optical recording medium 30.

When the wavelength of the recording and/or reproducing laser beam Lb is, for example, 405 nm, the wavelength of the gap detection laser beam Lg may be approximately 800 nm.

To record information signals in the optical recording medium 30 by the optical disk apparatus, the recording laser beam Lb emitted from the recording and/or reproducing laser light source unit 31 is first transmitted through the PBS 32. The recording laser beam Lb transmitted through the PBS 32 is reflected off the dichroic mirror 17 through the intermediary of the quarter wave plate 33, then incident upon the object lens 18 and the SIL 19. Then, the recording laser beam Lb condensed onto the distal end surface 19a of the SIL 19 permeates, causing the information signals to be recorded in the optical recording medium 30.

To reproduce the information signals from the optical recording medium 30 by the optical disk apparatus, the reproducing laser beam Lb emitted from the recording and/or reproducing laser light source unit 31 is first transmitted through the PBS 32. The reproducing laser beam Lb transmitted through the PBS 32 is reflected off the dichroic mirror 17 through the intermediary of the quarter wave plate 33, then incident upon the object lens 18 and the SIL 19. This causes the recording laser beam Lb condensed onto the distal end surface 19*a* of the SIL 19 to permeate. The return light reflected off the signal recording surface 30*a* of the optical recording medium 30 is transmitted through the SIL 19 and the object lens 18, reflected by the dichroic mirror 17, transmitted through the quarter wave plate 33, and incident upon the PBS 32. The return light is reflected off the PBS 32, incident upon the condensing lens 34, and condensed onto the PD 35 by the condensing lens 34. The PD 35 detects the optical power of the return light, and the PD 35 issues an electrical signal on the basis of the detected optical power of the return light. The electrical signal is supplied to the signal reproducer 36, and the information signals from the optical recording medium 30 is reproduced by the signal reproducer 36.

Thus, the optical disk apparatus according to the second embodiment is adapted to carry out recording and/or reproducing of information signals in and/or from the optical recording medium 30. Moreover, as described in the first embodiment, the gap control can be implemented by using the gap detection laser beam Lg having a different wavelength from that of the recording and/or reproducing laser beam Lb. This arrangement protects the gap control from being adversely affected when the power or the like of the recording and/or reproducing laser beam Lb is changed according to individual recording and/or reproducing conditions or the like. In the second embodiment, the irradiation power of the gap detection laser beam Lg can be adjusted to obtain a sufficient quantity of return light required for the gap control even if the irradiation power of the recording and/or reproducing laser beam Lb is small. Furthermore, according to the second embodiment, even if the recording laser beam Lb is modulated, the detection laser beam Lg will not be subjected to the influences of the modulation.

According to the embodiment, the convergence angle α of the gap detection laser beam Lg can be adjusted by the group of convergence angle adjusting lenses 16, so that the chromatic aberration of the converging lens assembly 23 attributable to the difference in wavelength from the recording and/or reproducing laser beam Lb can be corrected. Therefore, the gap control for maintaining the constant distance between the distal end surface 19*a* of the SIL 19 and the signal recording surface 30*a* of the optical recording medium 30 can be stably performed with high accuracy leading to an improved SNR of the optical recording medium 30. Further stable gap control with higher accuracy can be achieved, allowing the SNR of the optical recording medium 30 to be further improved by adjusting the convergence angle α of the gap detection laser beam Lg by the group of convergence angle adjusting lenses 16 so as to maximize the quantity of the return light, which has been transmitted through the PBS 14.

Furthermore, in the second embodiment, the wavelength of the gap detection laser beam Lg is brought close to the wavelength of the recording and/or reproducing laser beam Lb, making it possible to reduce the chromatic aberration itself of the object lens 18 and the SIL 19. Hence, the diameter of the group of convergence angle adjusting lenses 16 or the like can be decreased, permitting a reduced size of an optical system incorporating the group of lenses.

In addition, the second embodiment is adapted to properly select the wavelength and power of the gap detection laser beam Lg so as not to damage the optical recording medium 30, thus permitting good recording and/or reproduction in and/or from the optical recording medium 30.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the invention. In the embodiments described above, the components of the laser beam incident upon the distal end surface 19*a* of the SIL 19 at the critical angle or more has been the components of the laser beam in the region where the NA of the converging lens assembly is 1 or more. This is based on the assumption that the material filling in the gap is air (the refractive index of air being about 1.0002918). Alternatively, if exposure or the like is Performed while pouring water in the vicinity of the gap, as in the case where the exposure or the like is carried out while a negative and the entire lens assembly are immersed in water, then the material filling in the gap is the water (the refractive index of water being about 1.3). In this case, therefore, the component of a laser beam incident upon the distal end surface 19*a* of the SIL 19 at the critical angle or more will be the component of a laser beam in the region where the NA of the converging lens is 1.3 or more. Thus, regarding the component of a laser beam incident upon the distal end surface 19*a* of the SIL 19 at the critical angle or more, the component of the laser beam in the region of a particular NA of the converging lens assembly varies, depending on the type of material filling in the gap.

Figure 3:
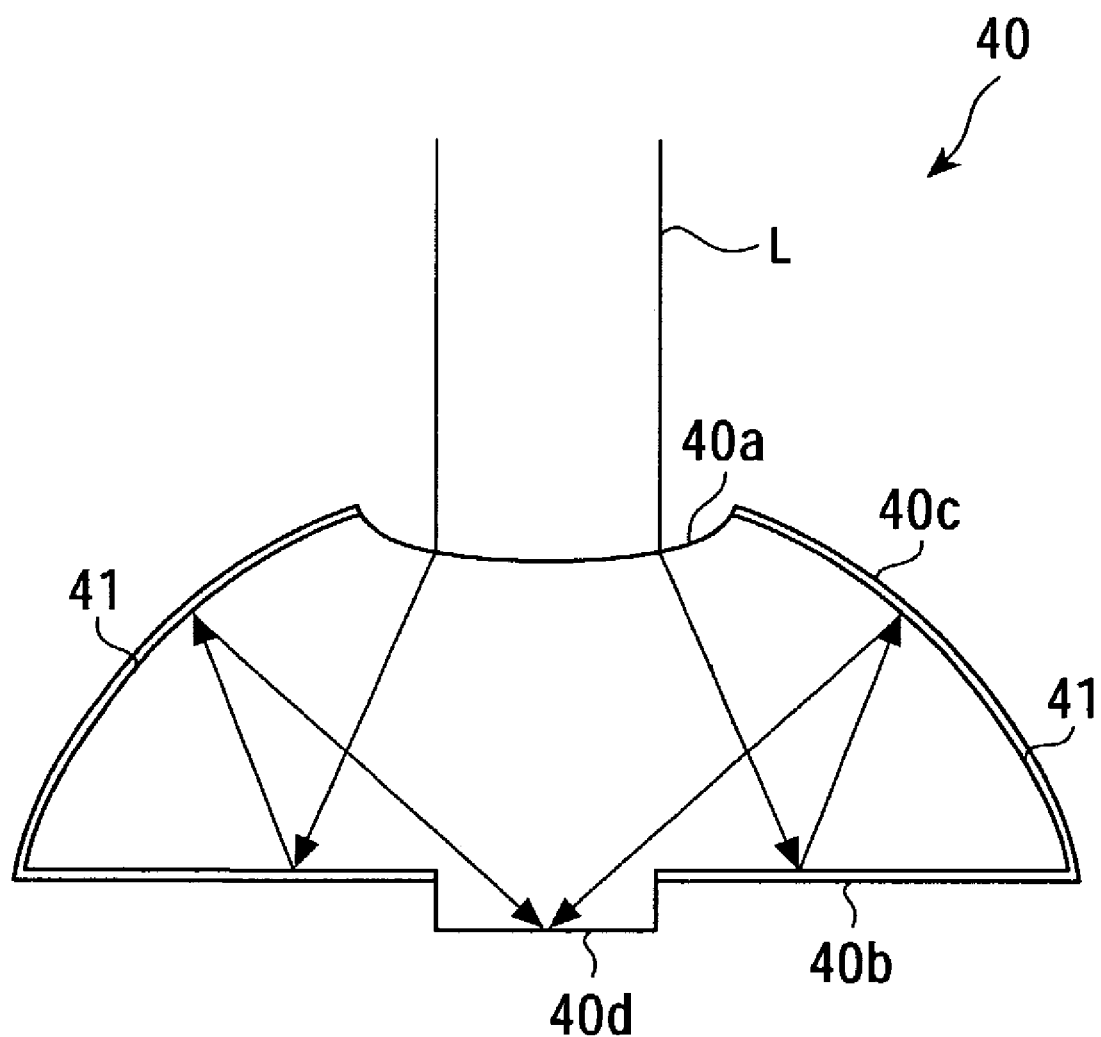
FIG. 3 is a sectional view of a SIM applicable as a converging lens used with the exposure apparatus in accordance with the present invention.

In the foregoing embodiments, the descriptions have been given of the examples using the converging lens assembly 23 constructed of the object lens and the SIL. Alternatively, however, a solid immersion mirror (SIM) having a curved surface that exhibits a high NA, as shown in FIG. 3, may be used. When a SIM 40 is used, a laser beam L from a light source is incident upon a surface 40*a* formed of, for example, a concave spherical surface, then reflected off a reflective film 41 of a plane surface 40*b* and further reflected on the reflective film 41 of a surface 40*c* formed of, for example, a convex spherical surface. The laser beam L reflected off the reflective film 41 of the surface 40*c* is condensed onto a convex surface 40*d* opposing an object to be irradiated. The laser beam L condensed onto the convex surface 40*d* permeates, allowing the object to be irradiated.

In the present invention, the converging lens assembly may alternatively be an optical device formed of three or more groups, as long as it includes SIL or SIM and a laser beam is incident upon the distal end surface of the SIL or SIM at not less than an angle that permits total reflection of the light.

In the foregoing embodiments, the descriptions have been given of the example where the gap detection laser beam Lg is converged through the group of convergence angle adjusting lenses 16. As an alternative, the gap detection laser beam Lg may be diverged through a group of divergence angle adjusting lenses, depending on the relationship between the exposure laser beam La and the gap detection laser beam Lg.

In the embodiments described above, a beam stop for absorbing the light from the gap detection laser beam Lg reflected off the NBS 13 may be provided. This makes it possible to prevent the light reflected off the NBS 13 from bouncing back to the NBS and adversely affecting the accuracy of gap detection.

Thus, the exposure apparatus, the exposure method, a recording and/or reproducing apparatus and a recording and/or reproducing method make it possible to correct chromatic aberration of a converging lens assembly by converging or diverging a gap detection laser beam even if a gap detection laser beam having a different wavelength from that of an exposure laser beam or a recording and/or reproducing laser beam is used to carry out gap control. This arrangement permit highly accurate, stable gap control to be accomplished.

What is claimed is:

1. An exposure apparatus, comprising: an exposure laser light source for emitting an exposure laser beam;
  a detection laser light source for emitting a detection laser beam that has a wave length different from that of the exposure laser beam;
  a converging lens assembly upon which the exposure laser beam and the detection laser beam are incident and which is disposed in a near-field region of an exposure surface of a negative;
  a group of convergence angle adjusting lenses for adjusting a convergence angle of only the detection laser beam incident upon the converging lens assembly;
  a detector for detecting a linearly polarized component of the detection laser beam reflected by a distal end surface of the converging lens assembly; and
  a controller for controlling the distance between the distal end surface of the converging lens assembly and the exposure surface on the basis of a detection signal from the detector.

2. The exposure apparatus according to claim 1, wherein the wavelength of the detection laser beam emitted from the detection laser light source is a wavelength that does not affect the exposure of the negative performed by the exposure laser beam.

3. The exposure apparatus according to claim 2, wherein the wavelength of the detection laser beam emitted from the detection laser light source is a wavelength that is close to the wavelength of the exposure laser beam emitted from the exposure laser light source.

4. The exposure apparatus according to claim 3, wherein the detectior laser beam emitted from the detection laser light source has optical energy that does not cause the negative to be exposed.

5. The exposure apparatus according to claim 1, further comprising a dichroic mirror that reflects either the exposure laser beam or the detection laser beam, while transmitting the other laser beam.

6. The exposure apparatus according to claim 1, wherein the detector detects the same linearly polarized component as the detection laser beam emitted from the detection laser light source through the intermediary of the dichroic mirror from among the detection laser beam reflected at the distal end surface of the converging lens assembly.

7. The exposure apparatus according to claim 6, wherein the converging lens assembly comprises an object lens, and a solid immersion lens disposed between the object lens and the exposure surface.

8. The exposure apparatus according to claim 7, further comprising: a polarizing beam splitter disposed in an optical path connecting the detection laser light source and the dichroic mirror; and a quarter wave plate disposed between the polarizing beam splitter and the dichroic mirror.

9. The exposure apparatus according to claim 8, further comprising a light absorbing member for absorbing the light among the detection laser beam emitted from the detection laser light source that has been reflected by the polarizing beam splitter.

10. The exposure apparatus according to claim 8, further comprising a beam splitter disposed in an optical path connecting the detection laser light source and the polarizing beam splitter.

11. The exposure apparatus according to claim 10, wherein the beam splitter is a normal beam splitter.

12. The exposure apparatus according to claim 10, wherein the detector detects, from the detection laser beam reflected by the distal end surface, the light that has been transmitted through the polarizing beam splitter and reflected by the beam splitter.

13. The exposure apparatus according to claim 1, wherein the group of convergence angle adjusting lenses comprises a concave lens and a convex lens.

14. A control method for a converging lens, comprising the steps of:
  guiding a second laser beam having a different wavelength from that of a first laser beam into a converging lens assembly disposed in a near-field region of a surface to be irradiated;
  adjusting a convergence angle of only the second laser beam incident upon the converging lens assembly;
  detecting a linearly polarized component of a laser beam reflected off a distal end surface of the converging lens assembly; and
  controlling the distance between the distal end surface of the converging lens assembly and the surface to be irradiated by moving the converging lens assembly in the direction of an optical axis on the basis of a detection signal obtained as a result of the detection.

15. The control method for a converging lens assembly according to claim 14, wherein the wavelength of the second laser beam is close to the wavelength of the first laser beam.

16. The control method for a converging lens assembly according to claim 14, further comprising a step of separating the first laser beam and the second laser beam by using a dichroic mirror that reflects one of the fist laser beam or the second laser beam, while transmitting the other.

17. The control method for a converging lens assembly according to claim 14, wherein the same linearly polarized component as the second laser beam emitted from the second laser light source is detected from the second laser beam reflected off the distal end surface of the converging lens assembly.

18. The control method for a converging lens assembly according to claim 17, wherein the converging lens assembly comprises an object lens, and a solid immersion lens disposed between the object lens and the exposure surface.

19. The control method for a converging lens assembly according to claim 18, wherein
  a polarizing beam splitter and a quarter wave plate that transmit the linearly polarized component of the second laser beam emitted from the second laser light source, while reflecting a linearly polarized component orthogonal to the aforesaid same linearly polarized component are used, and
  the light incident upon the distal end surface of the converging lens assembly at a critical angle or less is turned into the orthogonal linearly polarized component by the quarter wave plate so as to reflect it by the polarized beam splitter.

20. The control method for a converging lens assembly according to claim 19, wherein the light reflected by the polarizing beam splitter is absorbed by an absorbing member.

21. The control method for a converging lens assembly according to claim 18, wherein the light that has passed through the polarizing beam splitter from among the second laser beam reflected off the distal end surface is detected.

22. A controller for a converging lens assembly, comprising:
- a first laser light source for emitting a first laser beam;
- a second laser light source for emitting a second laser beam having a different wavelength from that of the first laser beam emitted from the first laser light source;
- a converging lens upon which the first laser beam and the second laser beam are incident and which is disposed in a near-field region of a surface to be irradiated;
- a group of convergence angle adjusting lenses for adjusting a convergence angle of only one of the first and second laser beams incident upon the converging lens;
- a detector for detecting a linearly polarized component of one of the first and second laser beams reflected off a distal end surface of the converging lens; and
- a controller for controlling the distance between the distal end surface of the converging lens and the surface to be irradiated on the basis of a detection signal from the detector.

23. The controller For a converging lens assembly according to claim 22, wherein the wavelength of the second laser beam emitted from the second laser light source is a wavelength that does not affect a physical change on the surface to be irradiated that is caused by the first laser beam.

24. The controller For a converging lens assembly according to claim 23, wherein the wavelength of the second laser beam emitted from the second laser light source is a wavelength close to the wavelength of the first laser beam emitted from the first laser light source.

25. The controller for a converging lens assembly according to claim 24, wherein the second laser beam emitted from the second laser light source has optical energy that does not affect a physical change on the surface to be irradiated that is caused by the first laser beam.

26. The controller for a converging lens assembly according to claim 22, further comprising a dichroic mirror that reflects either the first laser beam or the second laser beam, while transmitting the other laser beam.

27. The controller for a converging lens assembly according to claim 22, wherein the detector detects the same linearly polarized component as the second laser beam emitted from the second laser light source through the intermediary of the dichroic mirror from among the second laser beam reflected at the distal end surface of the converging lens assembly.

28. The controller for a converging lens assembly according to claim 27, wherein the converging lens assembly comprises:
- an object lens, and a solid immersion lens disposed between the object lens and the exposure surface.

29. The controller for a converging lens assembly according to claim 28, further comprising: a polarizing beam splitter disposed in an optical path connecting the second laser light source and the dichroic mirror; and a quarter wave plate disposed between the polarizing beam splitter and the dichroic mirror.

30. The controller for a converging lens assembly according to claim 29, further comprising a light absorbing member for absorbing the light among the second laser beam emitted from the second laser light source that has been reflected by the polarizing beam splitter.

31. The controller for a converging lens assembly according to claim 29, further comprising a beam splitter disposed in an optical path connecting the second laser light source and the polarizing beam splitter.

32. The controller for a converging lens assembly according to claim 31, wherein the beam splitter is a normal beam splitter.

33. The controller for a converging lens assembly according to claim 31, wherein the detector detects, from among the second laser beam reflected by the distal end surface, the light that has been transmitted through the polarizing beam splitter and reflected by the beam splitter.

34. The controller for a converging lens assembly according to claim 22, wherein the group of convergence angle adjusting lenses comprises a concave lens and a convex lens.

35. A recording and/or reproducing apparatus comprising:
- a recording and/or reproducing laser light source for emitting a recording and/or reproducing laser beam;
- a detection laser light source for emitting a detection laser beam having a wavelength different from that of the recording and/or reproducing laser beam;
- a converging lens assembly upon which the recording and/or reproducing laser beam and the detection laser beam are incident and which is disposed in a near-field region of a recording surface of a recording medium;
- a group of convergence angle adjusting lenses for adjusting a convergence angle of only the detection laser beam incident upon the converging lens assembly;
- a detector for detecting a linearly polarized component of the detection laser beam reflected by a distal end surface of the converging lens assembly; and
- a controller for controlling the distance between the distal end surface of the converging lens assembly and the recording surface on the basis of a detection signal from the detector.

36. The recording and/or reproducing apparatus according to claim 35, wherein the wavelength of the detection laser beam emitted from the detection laser light source is a wavelength that does not affect recording and/or reproduction of the recording medium by the recording and/or reproducing laser beam.

37. The recording and/or reproducing apparatus according to claim 36, wherein the wavelength of the detection laser beam emitted from the detection laser light source is a wavelength that is close to the wavelength of the recording and/or reproducing laser beam emitted from the recording and/or reproducing laser light source.

38. The recording and/or reproducing apparatus according to claim 37, wherein the detection laser beam emitted from the detection laser light source has optical energy that does not cause recording to be performed on the recording medium.

39. The recording and/or reproducing apparatus according to claim 35, further comprising a dichroic mirror that reflects either the recording and/or reproducing laser beam or the detection laser beam, while transmitting the other laser beam.

40. The recording and/or reproducing apparatus according to claim 35, wherein the detector detects the same linearly polarized component as the detection laser beam emitted from the detection laser light source through the intermediary of the dichroic mirror from among the detection laser beam reflected at the distal end surface of the converging lens assembly.

41. The recording and/or reproducing apparatus according to claim 40, wherein the converging lens assembly comprises:
- an object lens, and a solid immersion lens disposed between the object lens and the recording surface of the recording medium.

42. The recording and/or reproducing apparatus according to claim 41, further comprising: a polarizing beam splitter disposed in an optical path connecting the detection laser light source and the dichroic mirror; and a quarter wave plate disposed between the polarizing beam splitter and the dichroic mirror.

43. The recording and/or reproducing apparatus according to claim 42, further comprising a light absorbing member for absorbing the light among the detection laser beam emitted from the detection laser light source that has been reflected by the polarizing beam splitter.

44. The recording and/or reproducing apparatus according to claim 42, further comprising a beam splitter disposed in an optical path connecting the detection laser light source and the polarizing beam splitter.

45. The recording and/or reproducing apparatus according to claim 44 wherein the beam splitter is a normal beam splitter.

46. The recording and/or reproducing apparatus according to claim 44, wherein the detector detects, from the detection laser beam reflected by the distal end surface, the light that has been transmitted through the polarizing beam splitter and reflected by the beam splitter.

47. The recording and/or reproducing apparatus according to claim 35, wherein the group of convergence angle adjusting lenses comprises a concave lens and a convex lens.

48. The recording and/or reproducing apparatus according to claim 39, further comprising a signal detector for detecting the reflected light obtained by being reflected off a recording surface of the recording medium through the intermediary of the converging lens assembly and the dichroic mirror, and further reflected through the intermediary of the converging lens assembly and the dichroic mirror.

49. The recording and/or reproducing apparatus according to claim 48, further comprising a beam splitter for separating the reflected light and the recording and/or reproducing laser beam emitted from the recording and/or reproducing light source.

* * * * *